United States Patent
Khoshgard et al.

(10) Patent No.: US 11,290,903 B2
(45) Date of Patent: Mar. 29, 2022

(54) SPECTRUM MONITORING

(71) Applicant: SiTune Corporation, San Jose, CA (US)

(72) Inventors: Mahdi Khoshgard, Los Gatos, CA (US); Marzieh Veyseh, Los Altos, CA (US); Vahid M Toosi, Los Altos, CA (US)

(73) Assignee: SiTune Corporation, San Jose, CA (US)

( * ) Notice: Subject to any disclaimer, the term of this patent is extended or adjusted under 35 U.S.C. 154(b) by 156 days.

(21) Appl. No.: 16/514,598

(22) Filed: Jul. 17, 2019

(65) Prior Publication Data
US 2021/0022027 A1    Jan. 21, 2021

(51) Int. Cl.
*H04W 24/10*   (2009.01)
*H04W 24/08*   (2009.01)
*H04B 1/00*    (2006.01)

(52) U.S. Cl.
CPC ........... *H04W 24/10* (2013.01); *H04W 24/08* (2013.01); *H04B 1/0028* (2013.01); *H04B 1/0057* (2013.01)

(58) Field of Classification Search
CPC ....... H04W 24/10; H04W 24/08; G01S 7/021; H04B 7/10; H04B 17/18
See application file for complete search history.

(56) References Cited

U.S. PATENT DOCUMENTS

| | | | | |
|---|---|---|---|---|
| 4,612,625 A | * | 9/1986 | Bertrand | H03H 17/0664 708/313 |
| 5,504,785 A | * | 4/1996 | Becker | H04L 7/0029 375/344 |
| 6,263,195 B1 | * | 7/2001 | Niu | H04B 1/28 375/347 |
| 8,638,225 B1 | * | 1/2014 | Bocko | G07C 3/00 340/540 |

(Continued)

FOREIGN PATENT DOCUMENTS

EP     2282220 A1 *  2/2011  ............ G01R 23/16

OTHER PUBLICATIONS

Agilent, "Spectrum Analysis Basics", 2004, Agilent Technologies, Total pp. 120 (Year: 2004).*

*Primary Examiner* — Shah M Rahman
(74) *Attorney, Agent, or Firm* — Platinum Intellectual Property LLP

(57) ABSTRACT

Approaches provide for determining spectral information for a communications signal, such as a wideband communications signal. For example, a communications signal (e.g., a wideband signal) is received at a set of analog-to-digital converters (ADCs). The output of the ADCs is divided into a set of segments. A center frequency for each segment is determined based on the segment bandwidth and a number of segments in the set. The segments can be filtered, buffered, and analyzed using at least one digital signal processing technique (e.g., Fast Fourier Transform (FFT) technique to generate a representation of the segments (Continued)

in the frequency domain. Thereafter, the spectrum of frequency components (i.e., the frequency-domain representation) of the segments can be used to determine the power spectral density of the communications signal for different resolutions based on a resolution mode of the system or other criteria of the system.

18 Claims, 8 Drawing Sheets

(56) References Cited

U.S. PATENT DOCUMENTS

| | | | | |
|---|---|---|---|---|
| 2002/0073436 | A1* | 6/2002 | Cowley | H04L 27/2647 |
| | | | | 725/131 |
| 2003/0039319 | A1* | 2/2003 | Engelse | H04B 3/46 |
| | | | | 375/316 |
| 2003/0056221 | A1* | 3/2003 | Zhang | G06F 21/74 |
| | | | | 725/70 |
| 2004/0042557 | A1* | 3/2004 | Kabel | H04B 1/406 |
| | | | | 375/260 |
| 2004/0130666 | A1* | 7/2004 | Suzuki | H04B 1/005 |
| | | | | 348/725 |
| 2005/0078225 | A1* | 4/2005 | Yen | H03J 1/0091 |
| | | | | 348/732 |
| 2007/0294739 | A1* | 12/2007 | Walston | H04N 21/6168 |
| | | | | 725/117 |
| 2008/0089401 | A1* | 4/2008 | Lai | H04W 24/00 |
| | | | | 375/226 |
| 2009/0310661 | A1* | 12/2009 | Kloper | H04B 17/318 |
| | | | | 375/224 |
| 2013/0101012 | A1* | 4/2013 | Toosi | H04L 25/03 |
| | | | | 375/235 |
| 2013/0230131 | A1* | 9/2013 | Moore | H04B 1/30 |
| | | | | 375/350 |
| 2014/0286183 | A1* | 9/2014 | Min | H04L 1/0001 |
| | | | | 370/252 |
| 2015/0172086 | A1* | 6/2015 | Khoshgard | H04L 27/2657 |
| | | | | 375/260 |
| 2015/0288532 | A1* | 10/2015 | Veyseh | H04L 12/283 |
| | | | | 370/310 |
| 2016/0127931 | A1* | 5/2016 | Baxley | G06F 16/951 |
| | | | | 455/67.16 |

* cited by examiner

SPECTRUM MONITORING

BACKGROUND

With high bandwidth applications (e.g., full band cable and satellite receivers, serial links and short-range wireless communications) becoming more and more popular, there is increasing demand to provide additional services, such as Internet data, voice, and video services using existing cable TV systems without impacting the customer experience. However, it is a challenge to provide these services and quickly and accurately find impairments such as interference and distortion. Conventionally approaches require the use of expensive equipment, such as a spectrum analyzer, to identify impairments. However, technicians have to be trained and deployed to sites to obtain measurements. This can be costly and time-consuming. Further, field technicians are limited by the amount of time they can monitor the system. Other approaches attempt to determine some readings and interpolate the findings. These approaches, however, lack resolution and are not reliable. What is needed is an approach to continually monitor the spectrum of high bandwidth applications.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1:
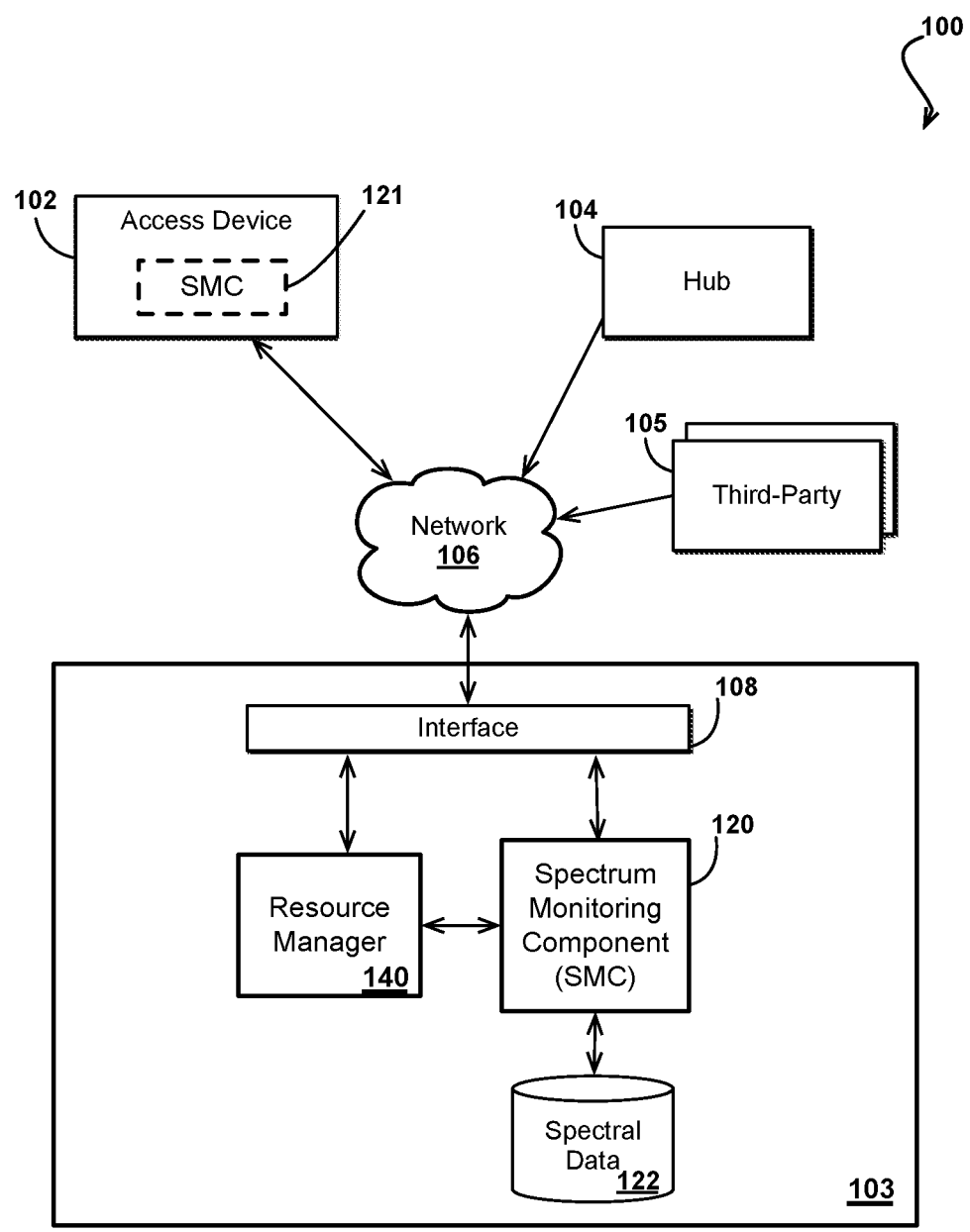
FIG. 1 illustrates a block diagram of a system that can be utilized in accordance with various embodiments.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Systems and methods in accordance with various embodiments of the present disclosure may overcome one or more of the aforementioned and other deficiencies experienced in conventional approaches to spectrum analysis. In particular, various embodiments describe systems and methods for determining spectral information for a communications signal, such as a wideband communications signal.

For example, a communications signal (e.g., a wideband signal) is received at a set of analog-to-digital converters (ADCs) at an access device, such as a cable modem, set-top box, hardened modem in an outdoor monitoring station, remote-PHY, wireless modems, wireless base stations, or other appropriate device. The device can be located at, for example, a subscriber's home or business, or at Remote-PHY, or other appropriate location. The subscriber, for example, can be a consumer of high bandwidth applications provided via one or more network providers that enable access to media content, such as video, data, voice. The digitized output of the ADCs is divided into a set of segments, where each segment is associated with a segment bandwidth. The set of segments includes a predetermined number of segments. The predetermined number of segments can be based on, for example, a particular implementation of the system.

A center frequency for each segment is determined based on the segment bandwidth and the number of segments in the set.

In accordance with various embodiments, the segments can be filtered, buffered, and analyzed using at least one digital signal processing technique (e.g., Fast Fourier Transform (FFT) technique to generate a representation of the segments in the frequency domain. Thereafter, the "spectrum" of frequency components (i.e., the frequency-domain representation) of the segments can be used to determine the power spectral density of the communications signal for different resolutions based on a resolution mode of the system or other criteria of the system.

In an implementation, the present disclosure is to a system including, for example, a set of analog-to-digital converters (ADCs), a digital mixer, a filter component, a buffer component a spectrum analyzer component, a power component, an averaging component, a segment controller, and other appropriate components. The set of ADCs can provide ADC outputs (e.g., digital outputs) of an input communications signal (e.g., a wideband signal). The segment controller can, in an example, generate a set of segments from the communications signal, determine a center frequency of each segment, and apply the center frequency to a digital mixer to translate the frequency of a segment to a baseline frequency. The filter component can, for example, filter individual segments. The buffer can, for example, buffer the segments, and the spectrum analyzer or other spectral analysis component can, for example, generate a frequency-domain representation of the buffered segments. The power component can perform at least one power spectral density technique on individual segments to determine power spectra for each of the segments. The averaging component can, for example, average the power spectra for each of the segments, and the power spectra for each segment can be stored. Thereafter, the power spectra for the segments can be used to determine the power spectrum of the input communications signal for different resolutions based on a resolution mode of the system or other criteria of the system.

Advantageously, network providers, for example, Internet service providers, can adjust a resolution parameter or other such parameter to control the resolution mode to zoom in or zoom out on different frequency ranges to view the power spectrum of the input communications signal for those frequency ranges. For example, a network disturbance can be detected on a network. In response to the disturbance, or according to a schedule or other such interval of time, a network operator can invoke a function call or other request to view a spectrum of one or more communications signals on the network. The function call can include, for example, a resolution parameter and a request to "zoom in" to view the power spectrum of one or more users of the network for a specific frequency range, or 'zoom out" to view the power spectrum for a larger frequency range, including, for example, substantially the entire frequency range of the communications signals. The amount of zoom can be based on the resolution parameter, which indicates a particular resolution mode. As will be described further herein, the resolution mode can be used to program a decimation filter or other appropriate filter, which can be used to zoom in or zoom out on the spectrum. Accordingly, such approaches allow the network operator to view the spectrum to, for example, determine information that indicates one or more entities that may be blocking the network at a particular geographical location. The information (e.g., location information, user information, etc.) can then be used to take appropriate action to remedy the impairment.

Various other functions and advantages are described and suggested below as may be provided in accordance with the various embodiments.

FIG. 1 illustrates an example environment 100 in which aspects of the various embodiments can be implemented. It should be understood that reference numbers may be carried over between figures for similar components for purposes of simplicity of explanation, but such usage should not be construed as a limitation on the various embodiments unless otherwise stated. In this example, a subscriber can utilize an access device 102 to communicate across at least one network 106 with a resource provider environment 103. The subscriber, for example, can be a consumer of high bandwidth applications provided via one or more network providers that enable access to media content, such as video, data, voice, high-speed Internet services, etc.

The access device 102 can include any appropriate electronic device operable to facilitate network communications over an appropriate network. Examples of such access devices 102 include modems or other devices (e.g., cable modems, set top terminals, routers, etc.) communicating via the network.

The access device 102 can communicate with a hub 104 across a particular path through network 106. In some embodiments, access device 102 may share a portion of its particular communication path to hub 104 with one or more other access devices (e.g., access devices on the same street, on the same building floor, or otherwise in a similar geo-spatial region). In some embodiments, hub 104 may include a termination system (e.g., a cable modem termination system (CMTS) or other type of similar system.

The network(s) 106 can include any appropriate network, including an intranet, the Internet, a cellular network, a local area network (LAN), optical, hybrid-fiber coaxial (HFC), twisted pair, or any other such network or combination, and communication over the network can be enabled via wired and/or wireless connections.

While some embodiments are described in the context of communications between modems and a termination system in network, other embodiments may include different types of access devices (e.g., fiber optic modems, wireless transceivers, gateways, set-top terminals, digital video recorders) and/or different types of hubs (e.g., optical line terminals, wireless base stations, satellites). Such networks may use any of numerous communication protocols and various different types of physical communication media (e.g., twisted pair conductors, wireless RF communications, fiber optical link, etc.).

In some embodiments, for example, network 106 may be a digital subscriber line (DSL) network, hub 104 may be a DSL access module (DSLAM), and access device 102 may be DSL modems or other devices communicating via the DSL network. In still other embodiments, network 106 may be a satellite, cellular, or other wireless network, access device 102 may be a transceiver through which users can access the wireless network, and hub 104 may be a base station or other wireless network hub. In yet other embodiments, network 106 may include a Fiber to the Home (FTTH) network, Fiber to the Premises (FTTP) network, passive optical network (PON), RF over glass (RFOG) network, Digital Subscriber Line (DSL) network, multimedia over coax access (MOCA) network, etc.

In some embodiments, such as ones operated in accordance with Data-Over-Cable Service Interface Specification (DOCSIS) standards, a cable modem termination system or other such system may monitor communications from cable modems to collect data form access devices. In some embodiments, the network may comprise a hybrid fiber coaxial cable network that carries video data (e.g., a cable television signal) in addition to other data (e.g., packet data in accordance with one or more DOCSIS standards). For example, the network may carry data between a data processing facility (e.g., head end) and a set-top-box located in a client premises (e.g., a cable television signal) and data between a data processing facility (e.g., head end) and a cable modem located in a client premises (e.g., packet data in accordance with one or more DOCSIS standards).

Hub 104 may communicate over one or more links (e.g., a Gigabit Ethernet link) with the Internet, a private IP (internet protocol) data network, and/or other network that allows communications between access devices (via hub 104) and one or more external networks. In an embodiment, network 106 may include tens, hundreds, thousands or more access devices, and may be connected to a plurality of other networks.

The resource provider environment 103 can include any appropriate components for receiving information such as spectral characteristics of a communications signal and returning information or performing actions in response to the information. The resource provider environment 103 might include various types of resources that can be used to perform spectral analysis and monitoring, such as spectrum monitoring component 120, and/or for performing actions in response to receiving spectral characteristics. The resources can include, for example, spectrum monitoring component 120 operable to determine spectral information for a communications signal such a wideband signal, application servers operable to process instructions or database servers operable to process data stored in one or more data stores. The resources may be hosted on multiple server computers and/or distributed across multiple systems. Additionally, the components may be implemented using any number of different computers and/or systems. Thus, the components may be separated into multiple services and/or over multiple different systems to perform the functionality described herein. In some embodiments, at least a portion of the resources can be "virtual" resources supported by these and/or components.

In various embodiments, a spectrum monitoring component 121 can operate on an access device, such as access device 102. In certain embodiments, spectrum monitoring components can be configured to operate on various other network devices, including, for example, hubs, nodes, master head end, etc. of the network. For example, in accordance with various embodiments, spectrum monitoring component 121 can reside on access device 102 or other such device, hub 104, at the provider environment 103, or combination thereof, and can generate data representing a real-time spectrogram of a bandwidth of radio frequency (RF) spectrum.

In various embodiments, spectrum monitoring component 121 can be implemented, for example, with digital logic gates on a single or multiple semiconductor chips configured to perform the functions described herein. In another example, spectrum monitoring component 121 can be implemented with one or more semiconductor devices using a CMOS process. For example, the majority of the spectrum monitoring component can be implemented as part of or the entirety of an application specific integrated circuit (ASIC) by digital logic gates. It is also envisioned that for certain applications, some or all of the functions of the spectrum monitoring component can be implemented with software instructions stored on a processor readable medium, and executed by a processor, or another processor in another device coupled to receive as input the output an ADC that converts signals to a digital signal.

The spectral characteristics determined using one or more spectrum monitoring components as well as other determined or otherwise identified information can be provided to interface layer 108 of the provider environment 103. The interface layer 108 can include application programming interfaces (APIs) or other exposed interfaces enabling access devices to provide spectral characteristics of a communications signal to the provider environment 103. Interface layer 108 in this example can also include other components as well, such as at least one Web server, routing components, load balancers, and the like.

Once the spectral characteristics are received, the spectral characteristics can be stored in, for example, data store 122. The spectral characteristics can be analyzed according to some embodiments, and resource manager 140 or other appropriate component can identify devices that share communication paths or portions of paths, and to diagnose and locate network problems such as noise/interference ingress, attenuation, malfunctioning network elements, and other anomalies. In certain embodiments, resource manager can determine the status, health, or performance of the network based on the spectral characteristics. For example, resource manager can use a trained model (e.g., a neural network or other machine learning-based model) to process the spectral characteristics to determine an appropriate action to remedy any network anomalies. Advantageously, spectrum monitoring component 121 can provide on-chip spectral analysis capability practically and economically. For instance, approaches described herein can reduce or eliminate the need for external spectrum computation equipment.

In some embodiments, the features and services provided by the system may be implemented as web services consumable via a communication network. In further embodiments, the system is provided by one more virtual machines implemented in a hosted computing environment. The hosted computing environment may include one or more rapidly provisioned and released computing resources, which computing resources may include computing, networking and/or storage devices.

Third-party 105, for example, a provider of communication services can utilize spectral information obtained by provider environment 103, such as spectral characteristics stored in data store 122 or other appropriate component, to perform one or more spectrum management functions to diagnose and locate network problems such as noise/interference ingress, attenuation, malfunctioning network elements, and other anomalies, as well as determine the status, health, or performance of the network based on the spectral characteristics. In another example, the spectral information can be used at cable network head ends to set the signal power at various frequencies for transmission to subscribers. Thus, it is important to be able to monitor and analyze signal power concurrently across all appropriate frequencies.

Figure 2:
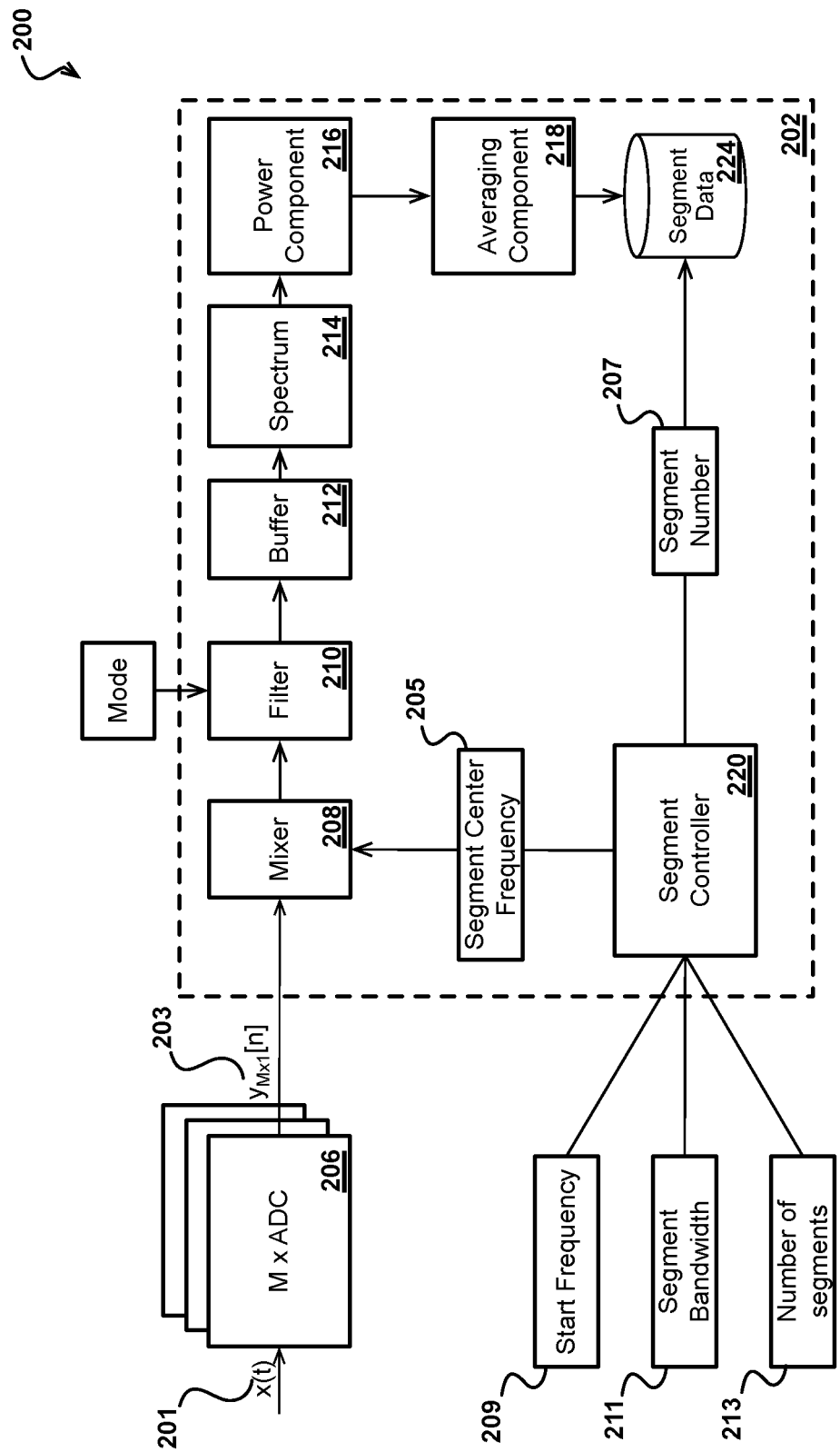
FIG. 2 illustrates a block diagram of a system for spectrum monitoring in accordance with various embodiments.

FIG. 2 illustrates a block diagram of system 200 for determining spectral information for a communications signal in accordance in an embodiment. As described, a communications signal (e.g., wideband signal) 201 is received at a set of analog-to-digital converters (ADCs) 206. The ADCs are configured to, for example, convert communications signal 201 (i.e., a continuous-time and continuous-amplitude analog signal) to a discrete-time and discrete-amplitude digital signal 203. It should be noted that in certain embodiments the set of ADCs can include a single ADC. The communications signal can be an analog waveform having a spectrum having at least an upper frequency and lower frequency, or range of potential upper and lower frequencies.

Segment controller 220 is operable to generate or otherwise identify a set of segments from the output of the set of ADCs. The number of segments 213 in the set can be obtained via a configuration file, based on the system specifications, a default number etc. For example, in certain embodiments, the number of segments is based on the hardware and/or software implementation of the system.

The segments can be arranged in a particular order, such as the order in which the segments are generated or some other order. A position of a segment can correspond to a reference or position number. For example, the first segment can correspond to segment position number one, the second segment can correspond to segment position number two, and so on. In some embodiments, the segments can be ordered consecutively; however, other ordering approaches are contemplated in accordance with the various embodiments described herein.

In certain embodiments, the segments can be separate digital elements. In various embodiments, the segments can be identified by a start frequency, an end frequency, and a segment number 207. In other embodiments, the segments can be identified by a start and an end frequency, where the frequency bounds correspond to the frequency bounds of the output of the ADCs. In various embodiments, the start and end frequency can correspond to a lower and an upper frequency. It should be noted that any number of approaches can be used to identify segments of the signal, where the segments can be separate signals from the input communications signal, or part of a continuous input signal where metadata, address information, or other information can be used to locate or otherwise identify segments of the input signal.

Segment controller 220 is further configured to determine the segment bandwidth 211 for each of the segments, or at least one or more of the segments. The segment bandwidth for a particular segment can be determined based on the sampling frequency of ADCs 206, a resolution mode, and the decimation filter guard ratio 213. In accordance with various embodiments, the resolution mode can be provided by a user (e.g., network operator) or other process or other appropriate entity, determined from a configuration file, set from a default value, or dynamically determined based on state information of the system. The number of segments in the set can be predetermined and can be based on, for example, a particular implementation of the system. In certain embodiments the number of segments can be dynamically determined based on, for example, an operating state of the system, a particular application for which embodiments herein are utilized, etc.

Segment controller 220 is further configured to determine a start frequency 209 for each of the segments, or at least one or more of the segments. The start frequency is based on the order of the segments and the segment bandwidth of each of the segments.

For each segment, segment controller 220 can apply the segment center frequency 205 of that segment to a digital mixer 208 that translates the center frequency of the segment to a baseline frequency, such as DC. This can include, for example, downmixing the frequency associated with the segment. In accordance with an embodiment, the digital mixer can be a down-mixer or another appropriate mixer.

The resulting segments can be filtered using, for example, a decimation filter or other such filter from filter component 210. In accordance with various embodiments, the decimation filter can be based on a resolution mode, where the resolution mode can be a default mode, a mode selected by a user (e.g., a network operator), etc. The resolution mode, in certain embodiments, can be used to program the decimation filter.

Buffer component 212 can buffer the filtered segments, and the buffered segments can be analyzed using at least one digital signal processing technique (e.g., Fast Fourier Transform (FFT), or any other spectral analysis techniques that are apparent to persons skilled in the relevant art) associated with spectrum analyzer component 214 or other appropriate spectral analysis component. In an embodiment, spectrum analyzer component 214 can implement one or more FFT techniques, where one of the techniques can be associated with an FFT size. The FFT size can, for example, define the number of bins for dividing the window size of the FFT. The window size, for example, can influence the temporal or frequency resolution, or precision of the representation of the signal. Example sizes include 256, 512, 1024, 2048, etc.

Power component 216 is configured to determine the power spectrum value for each segment. For example, power component 216 can use one or more power computing approaches to, for example, determine the square of the magnitude of the Fourier transform of a segment.

Averaging component 218 can use at least one spectral averaging approach to average the output power spectrum. It should be noted that other power spectral density procedures and/or determining the average value of power spectral density are contemplated in accordance with the various embodiments described herein.

The averaged output power spectrum for the segment can be stored in data store 224 or other appropriate storage device and/or otherwise utilized. The averaged output power spectrum can be stored in the order it was determined. For example, the averaged output power spectrum for the second segment can be stored after the averaged output power spectrum of the first segment, and so on. The process can continue until each of the segments, or at least until a threshold number of segments is processed, or until another stop condition is satisfied.

The sequence of the averaged output power spectrum can thereafter be accessed at any time. For example, based on the resolution mode, a user can "zoom in" to analyze particular portions of the spectrum in greater detail or take an FFT performed across the entire spectrum on the input signal. Such approaches provide a user (e.g., network operatory) flexibility to choose the resolution mode and spectrum bandwidth depending on the application, and capture the frequency spectrum all at once.

It should be noted that although ADCs 206 are shown outside spectrum monitoring component 202, in accordance with various embodiments, ADCs 206 can be included in spectrum monitoring component 202. It should be further noted that components described herein can include or at least be in communication with other components. Additionally, the components may be implemented using any number of different components. Thus, the components may be separated into multiple components or chips to perform the functionality described herein.

Advantageously, approaches described herein allow for determining the power spectrum of a wideband signal for different resolutions, which enables providers of such signals to continually monitor the power spectrum from one or more geographical locations as well as adjust a parameter to control whether they want to zoom in and get a high resolution reading of the spectrum (e.g., the absolute power of the signal in frequency from a first frequency to a second frequency of the spectrum), or zoom out and get a higher resolution reading of the spectrum. Continuous spectrum monitoring is often used as the first part of an interference searching process. However, spectrum monitoring can also be used to determine spectrum availability, characterize emissions, analyze transmission patterns, continually ensure that critical frequency bands are clear, detect illicit transmissions, and manage assigned spectrum.

As described, conventional approaches include going to the desired site, setting up a spectrum analyzer, and observing the desired part of the spectrum. Although such an approach allows for interactively manipulating the spectrum analyzer setup for the best results, the process is, and the devices are expensive, which can be cost prohibitive for some providers. Further, the interfering signal may not be present when the technician is at the site. Also, many spectrum monitoring tasks require more than simply observing the signal visually. Further still, it may be important to record the signal for later analysis to examine, for example, for bandwidth, shape, and spectrum usage. This may be to understand current spectral usage patterns or to monitor for signals that do not belong in a particular spectrum.

Accordingly, in accordance with various embodiments, approaches described herein enable a periodic or continuous spectrum monitoring program which allows for identification and removal of interfering signals that reduce the capacity of digital communications. Increasing capacity of digital communications is one benefit of spectrum monitoring, which can also help to understand better how a spectrum is being interfered with.

Figures 3A, 3B:
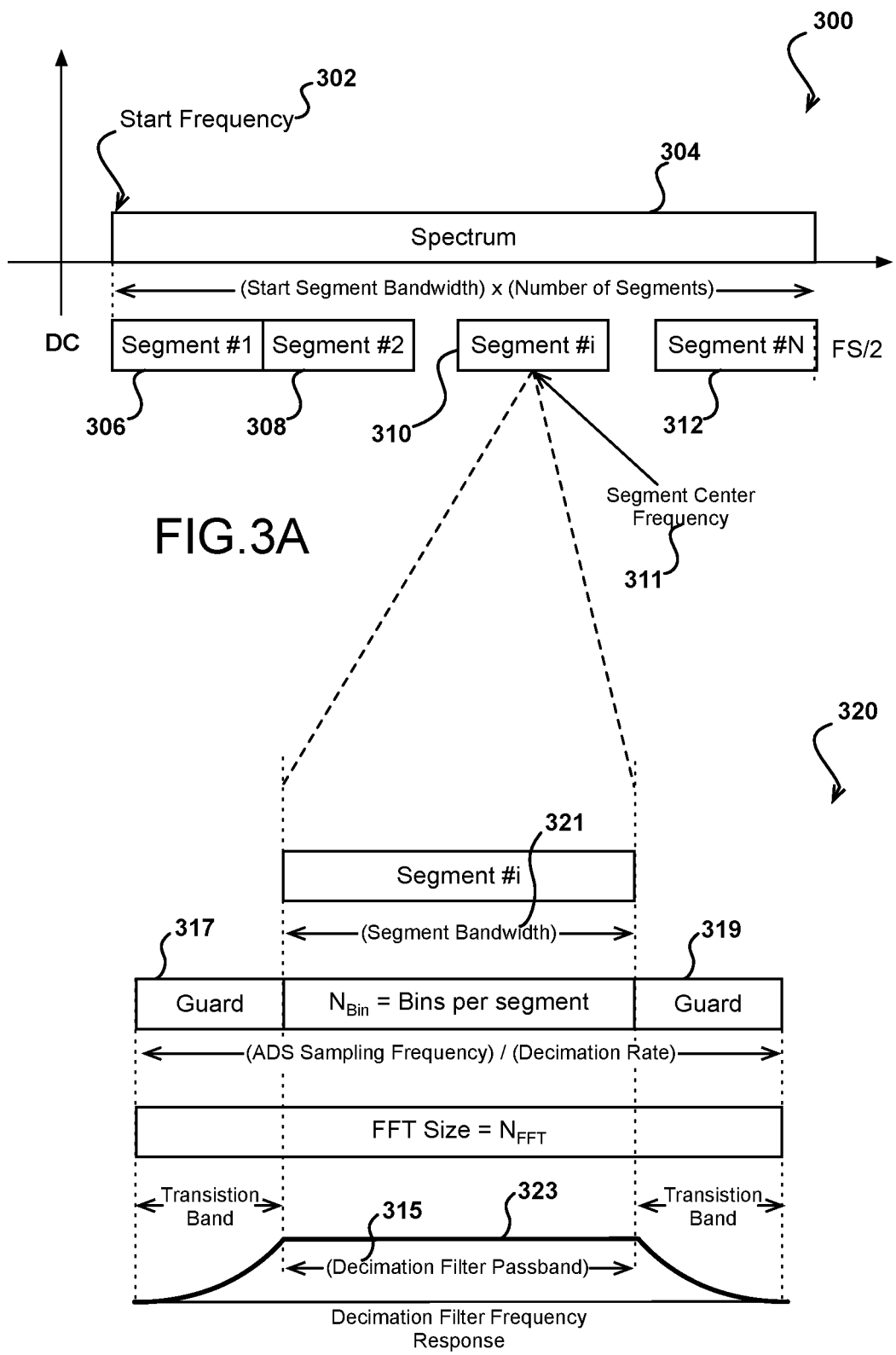
FIGS. 3A and 3B illustrate an example spectrum and characteristics of the spectrum that can be utilized in accordance with various embodiments.

FIG. 3A illustrates an example spectrum 300 of a communications signal and characteristics of the spectrum that can be utilized in accordance with various embodiments. In this example, a communications signal (e.g., a wideband signal) is received at a set of analog-to-digital converters (ADCs) included in an access device, such as a cable modem, set-top box, or other such device. The device can be located at, for example, a subscriber's home or business, or other appropriate location. The subscriber, for example, can be a consumer of high bandwidth applications provided via one or more network providers that enable access to media content, such as video, data, voice, high-speed Internet services, etc. The set of ADCs can generate a digital representation of the communications signal.

The output digital signal of the ADCs can be analyzed using at least one digital signal processing technique (e.g., Fast Fourier Transform (FFT) to generate a representation of the communications signal in the frequency domain. The "spectrum" 304 of frequency components (i.e., the frequency-domain representation) of the communications signal is in the band corresponding to $F_S/2$, where $F_S$ is the sampling frequency of the set of ADCs.

Spectrum 304 can be divided into a set of segments (306, 308, 310, 312). For example, in accordance with various embodiments, one or more ADCs can process the communications signal and an appropriate computing component (e.g., a segment controller) can segment the resulting digital signal. In an example, different portions of communications signal can be individually digitized by a separate ADC, and a digital signal processor or other appropriate component (e.g., a segment controller) can rearrange or otherwise manage the resulting segments. In another example, a single ADC can be utilized to digitize the communications signal and an appropriate computing component can generate segments of the digital signal.

In accordance with an embodiment, a segment can include a portion of a communications signal in the frequency domain. A segment can be defined by one or more characteristics, including, for example, a number of sample data points, a segment bandwidth, and the like. In an embodiment, the number of sample data points for a segment can be based on the ADC sampling frequency.

The number of segments ("N") in the set of segments can be determined based on, for example, an implementation of the system, a bandwidth, a resolution mode of the system, an operating state of the system, an application for which segments may be utilized with, etc.

For each segment, or at least a threshold number of segments, the segment bandwidth ("$S_{BW}$") can be determined. The segment bandwidth can be determined based on the sampling frequency ("$F_S$") of the set of ADCs, the resolution mode ("R") that can have a predetermined range and represents the resolution in which the spectrum capture is being taken, and the decimation filter guard ratio ("$N_{BIN}/N_{FFT}$"), where $N_{BIN}$ represents the number of bins per segment and $N_{FFT}$ represents the FFT size. In accordance with an embodiment, the segment bandwidth can be represented as:

$$S_{BW}=(F_S/R)\cdot(N_{BIN}/N_{FFT}) \qquad \text{Eq (1)}$$

where $F_S$ corresponds to the sampling frequency of the set of ADCs, R corresponds to the decimation rate (based on the decimation filter used to adjust the sample rate of a segment after ADC) or resolution mode, and $N_{BIN}/N_{FFT}$ corresponds to the ratio of $N_{FFT}$ to $N_{BIN}$ of the filter, representing the percentage of the total FFT bins that are allocated to the segment while the rest are used for the guard portions on the two sides of the decimation filter.

The sampling frequency can be based on, for example, properties of the set of ADCs. Different ADCs may have different sampling frequencies, for example, and the sampling frequency is a known value of the ADCs used to convert an analog signal into digital samples.

The resolution mode ("R") can be set by a user (e.g., a network operator) from a range of acceptable values (or be a default value) and can be used to zoom in or zoom out on the spectrum of the communications signal. That is, a high-resolution mode can correspond to zooming in on the spectrum and a low-resolution mode can correspond to zooming out on the spectrum to look at more of the spectrum.

The subcarrier spacing or bin bandwidth in each segment can be represented as $Res_{BW}=S_{BW}/N_{BIN}$. The value of $Res_{BW}$ is related to $F_S$, R, and $N_{FFT}$, which are hardware related parameters but can have a range of values, and as a result, $Res_{BW}$ can have a range of values that can directly show what is the distance between subcarriers in each segment. When the bin bandwidth or subcarrier spacing is larger, a user (e.g., network operator) can view a wider band, but with lower resolution. When the bin bandwidth or subcarrier spacing is smaller, the user can zoom in and view at higher resolution bins in frequency in a smaller band.

FIG. 3B illustrates an example relationship 320 between the decimation rate or resolution mode and the decimation filter frequency response 323. As shown in FIG. 3B, bandwidth of the decimation filter passband 315 is the segment bandwidth 321 plus the guard bands (317 and 319) on both sides. The decimation rate or the resolution mode has a range of values based on the design of the filter (number of modes) that defines the rate used to reduce $F_S$ or sampling rate of the signal out of ADC to the new value of $F_S/R$.

A center frequency 311 for each segment $F_{SEG(i)}$ can be determined based on the segment bandwidth 321 and the segment number in the set. In an embodiment, the center frequency for a segment ("i") can be represented as:

$$F_{SEG(i)}=F_{START}+(i-1)S_{BW}+(\tfrac{1}{2})S_{BW} \qquad \text{Eq (2)}$$

where $F_{SEG(i)}$ corresponds to the center frequency for a particular segment (i), $F_{START}$ corresponds to the start frequency 302 of the spectrum that is set by the user, and i corresponds to a particular segment. In an embodiment, a user (e.g., network operator) can select "R" or the resolution mode from a set of available values given by the hardware, and based on a selected "$F_S$", $S_{BW}$ can be determined. In an embodiment, the hardware/software can be used to define a maximum allowable number of segments (N).

The total monitored spectrum bandwidth ("S") of the signal can be represented as $S=N\times S_{BW}$, where N is the number of segments, and $S_{BW}$ is the segment bandwidth. The user (e.g., network operator) can select N to the maximum allowable value, and define the total spectrum bandwidth that will be captured according to the chosen R.

In an embodiment, the start frequency of the first segment can correspond to the start frequency of the spectrum. FFT size ("$N_{FFT}$") can correspond to the total number of points used to calculate the Fast Fourier Transfer function of the communications signal and/or segment of the communications signal. The number of bins ("$N_{Bin}$") in each segment can depend on the total number of bins ("FFT size") and the number of bins in the filter's guard bands.

The bandwidth of the decimation filter passband can be the segment bandwidth plus the guards on both sides, and the filter bandwidth can be calculated as the total ADC sampling frequency divided by resolution mode or decimation rate and divided by (number of bins in the segment/total FFT size). In an embodiment, the filter bandwidth can be represented as $(F_S/R)\cdot(N_{FFT}/N_{BIN})$.

Figure 4:
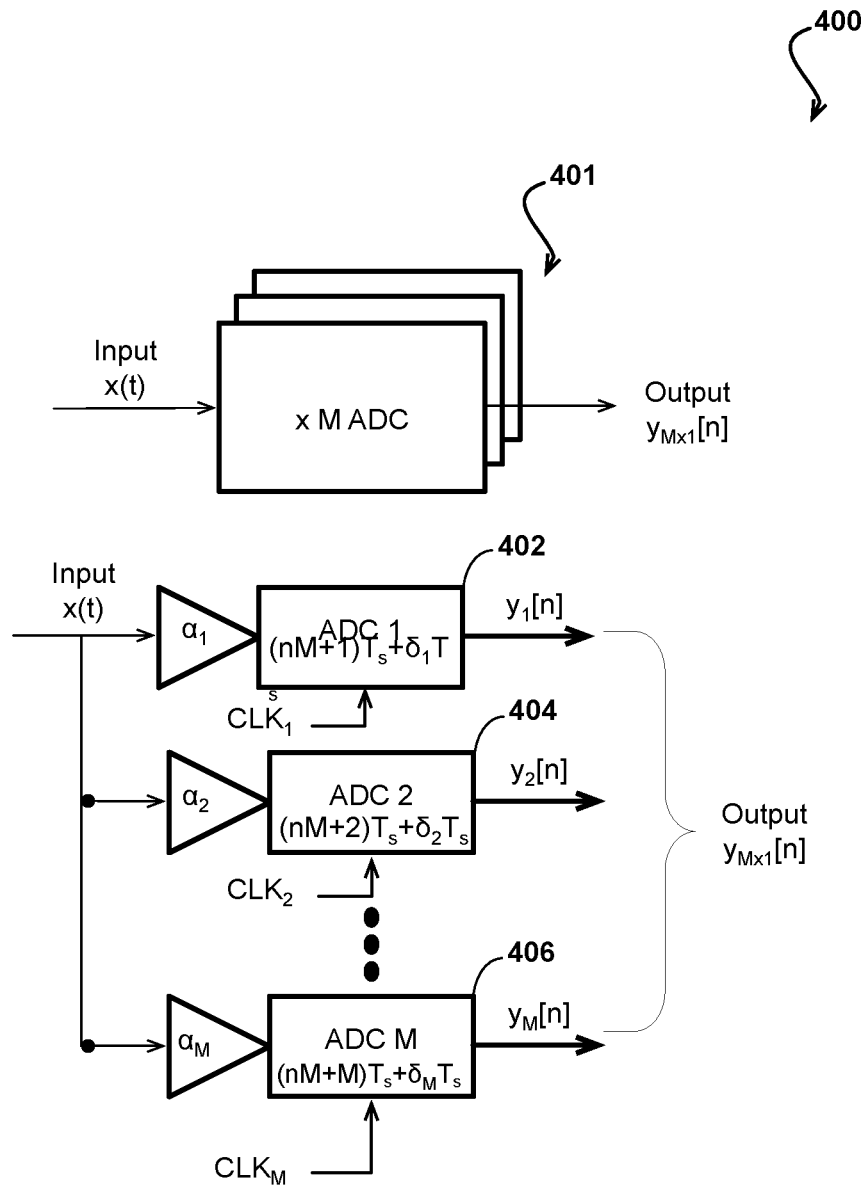
FIG. 4 illustrates a block diagram of a set of time-interleaved ADCs that can be utilized in accordance with various embodiments.

FIG. 4 illustrates a block diagram 400 of a set of time-interleaved ADCs that can be utilized in accordance with various embodiments. As shown in FIG. 4, a set of time-interleaved ADCs 401 can include time-interleaved high-speed ADCs 402, 404, and 406. In this example, ADCs 401 may consist of M parallel ADCs. The ADCs are configured to convert a continuous-time and continuous-amplitude analog signal to a discrete-time and discrete-amplitude digital signal. In accordance with various embodiments, when the ADCs perform the analog to digital conversion, the ADC samples the analog signal. The resulting digital signal is a sampled signal, obtained by sampling the analog signal at discrete points in time. The rate at which the ADCs sample the analog signal is the sampling rate.

For example, each of ADCs, marked in FIG. 4 as ADC #1, ADC #2, . . . ADC #M, receive the X(t) ADC input as well as clocks $CLK_1$, $CLK_2$, . . . $CLK_M$. FIG. 4 also illustrates that the function in the ADCs is $(nM+1)T_S+\delta_1\,T_S$, $(nM+2)T_S+\delta_2\,T_S\ldots(nM+M)T_S+\delta_M\,T_S$. The sampled signal provided at output $y_{M\times 1}[n]$ can be represented as:

$$\alpha_M \cdot X((nM+M+_M)\cdot T_S) \qquad \text{Eq (3)}$$

As described, the set of time-interleaved ADCs 402 convert X(t) to a digital signal, yM×1[n] by sampling the input analog signal X(t) at a sample rate F(s). The digital signal can be divided into a set of segments. In certain embodiments the segments can be filtered, buffered, and analyzed using at least one digital signal processing technique (e.g., Fast Fourier Transform (FFT) to generate a representation of the segments in the frequency domain. Thereafter, the segments can be used to determine the power spectral density of X(t) for different resolutions.

Figure 5:
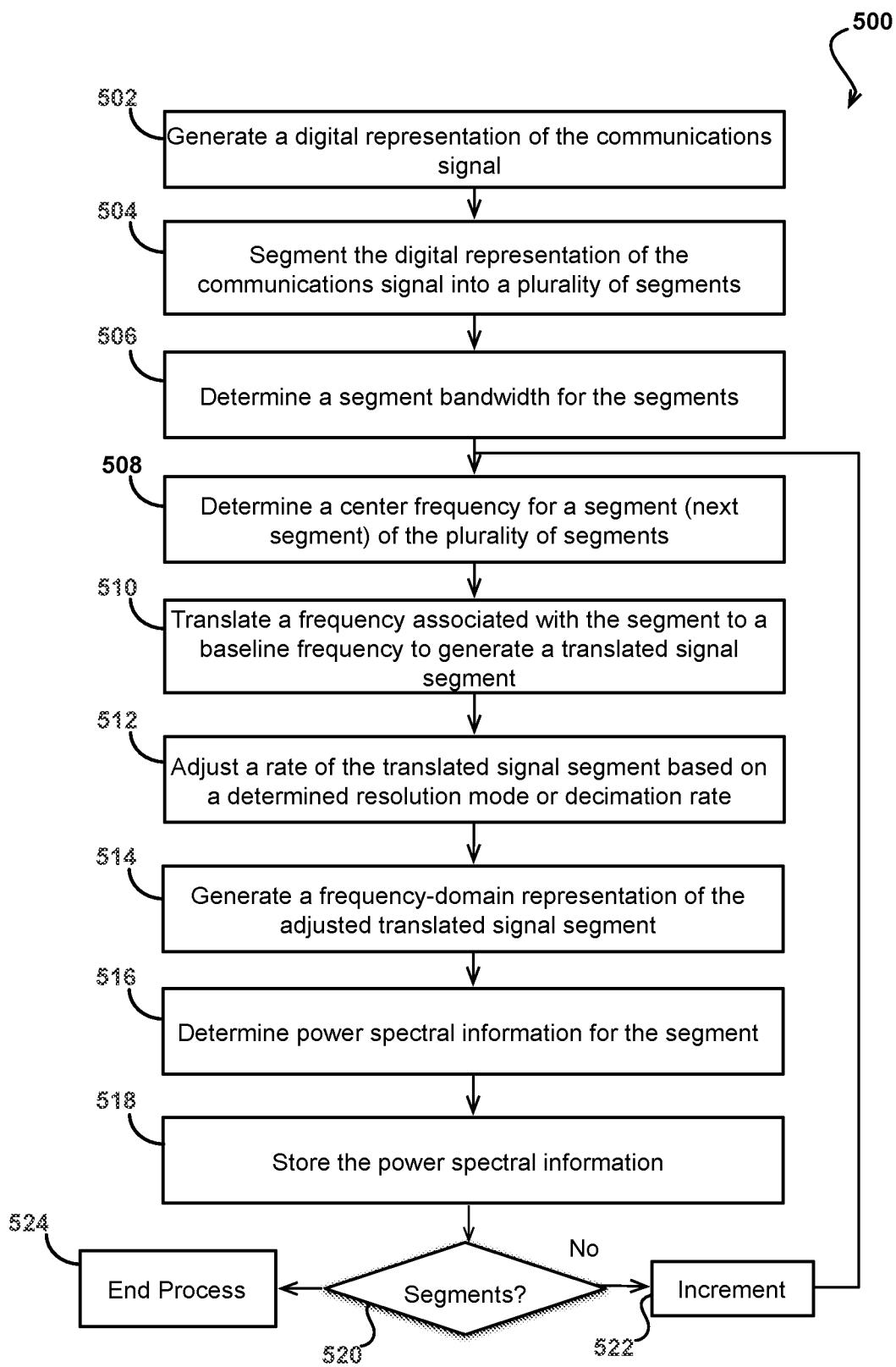
FIG. 5 illustrates an example process for determining spectral information for a communications signal in accordance with various embodiments.

FIG. 5 illustrates an example process 500 for spectrum monitoring in accordance with various embodiments. It should be understood that, for any process described herein, that there can be additional or fewer steps performed in similar or alternative orders, or in parallel, within the scope of the various embodiments unless otherwise stated. In this example, a time-domain representation of a communications signal is processed to generate 502 an output signal (e.g., a digital representation of the communications signal). The signal can be processed by, for example, one or more analog-to-digital converters (ADCs).

The digital representation of the communications signal can be segmented 504 into a plurality of segments. In accordance with an embodiment, a segment can include a portion of a communications signal in the frequency domain. The number of sample data points for a segment can be based on the ADC sampling frequency. The number of segments in certain embodiments can be predetermined and can be based on, for example, a particular implementation of the system. In some embodiments the number of segments can be dynamically determined based on, for example, an operating state of the system, a particular application for which embodiments herein are utilized, etc.

A segment bandwidth for the segments can be determined 506. The segment bandwidth can be determined, for example, based on a total sampling frequency of the ADCs, a resolution mode, and the decimation filter guard ratio. In various embodiments, the segment bandwidth is substantially the same for each of the segments. In an embodiment, the sampling frequency can be based on properties of the ADCs. The resolution mode can be set by a user (e.g., a network operator) from a range of acceptable values (or be a default value). The number of segments can be predetermined and can be based on, for example, a particular implementation of the system. A center frequency for a segment of the plurality of segments can be determined 508. The center frequency can be determined, for example, based on a start frequency of the spectrum, the segment bandwidth for the segments, and the number of segments in the set. A frequency associated with the segment can be translated 510 to a baseline frequency to generate a translated signal segment based at least in part on the center frequency. This can include, for example, downmixing the frequency associated with the segment. In various embodiments, a digital mixer can be utilized to translate the frequency of a segment to generate a translated signal segment. The baseline frequency can be DC, for example, or other predetermined frequency. In certain embodiments, the baseline frequency can be based on system inputs, and can dynamically change based on the system inputs.

The segment is passed through a decimation filter or other appropriate filter to adjust 512 its rate based on the determined resolution mode or decimation rate. A spectral analysis technique can be used on the translated signal segment to generate 514 a frequency-domain representation of the translated signal segment. As described herein, the segment may be filtered and/or buffered before being processed using a spectral analysis technique. Power spectral information can be determined 516 for the segment. For example, at least spectrum power computing approaches can be used to compute the square of the magnitude of the Fourier transform of the segment. In certain embodiments, the power spectral information for the segment is averaged or processed in another manner known to those in the art. The power spectral information for the segment can be stored 518. In an embodiment, the power spectral information for the segments can be stored in the order in which they are processed and/or otherwise be addressable in the order in which they are processed. For example, a first segment can be stored in a first memory position, a second segment can be stored in a second memory position, and so on. In this example, the memory positions correspond to the ordering of the segments. In some embodiments, the segments and/or the memory position of those segments can be associated with information that can be used to determine an order of the segments. Various other approaches to storing, addressing, and accessing power spectral information is contemplated in accordance with the embodiments described herein. A determination 520 is made whether additional segments are left to be processed. In the situation where there are additional segments, the segment count is incremented 522, and the center frequency of the next segment is determined 508. In the situation where the segments have been processed, or another stop condition is met, the spectral monitoring process can stop 524.

Figure 6:
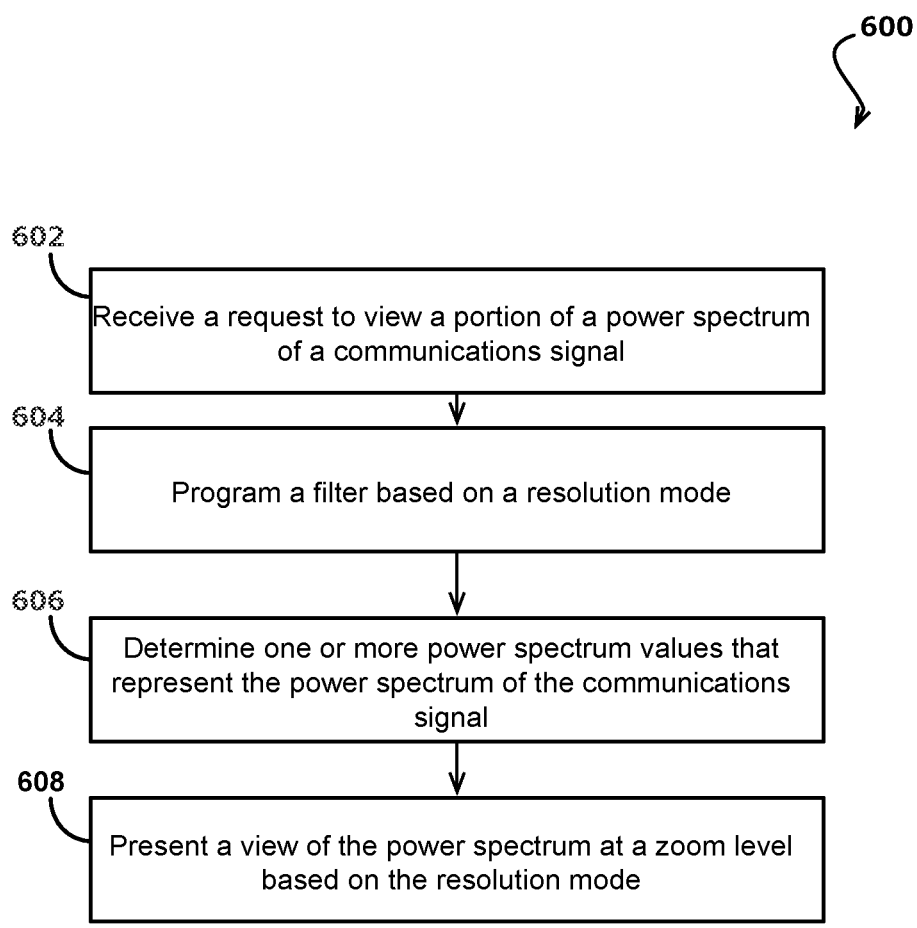
FIG. 6 illustrates an example process for determining spectral information for a communications signal in accordance with an alternate embodiment.

FIG. 6 illustrates an example process 600 for spectrum monitoring in accordance with an alternate embodiment. In this example, a function call other request to view a portion of a spectrum of one or more communications signals on a network is received 602. The function call can include, for example, a resolution parameter and a request to "zoom in" to view the power spectrum of one or more users of the network for a specific frequency range, or 'zoom out" to view the power spectrum for a larger frequency range, including, for example, substantially the entire frequency range of the communications signal. The amount of zoom can be based on the resolution parameter, which indicates a particular resolution mode. An appropriate filter can be programed 604 based on the resolution mode. As described herein, the filter can be a decimation filter, where the bandwidth of the decimation filter can be the bandwidth of a segment of the communications signal plus the guard bands. The communications signal can be processed based at least in part on the resolution mode to determine 606 one or more power spectrum values that represent the power spectrum of the communications signal. A view of the power spectrum can be presented 608 at an appropriate zoom level based at least in part on the resolution mode. For example, a high-resolution mode can correspond to zooming in on the spectrum and a low-resolution mode can correspond to zooming out on the spectrum to look at more of the spectrum.

Figure 7:
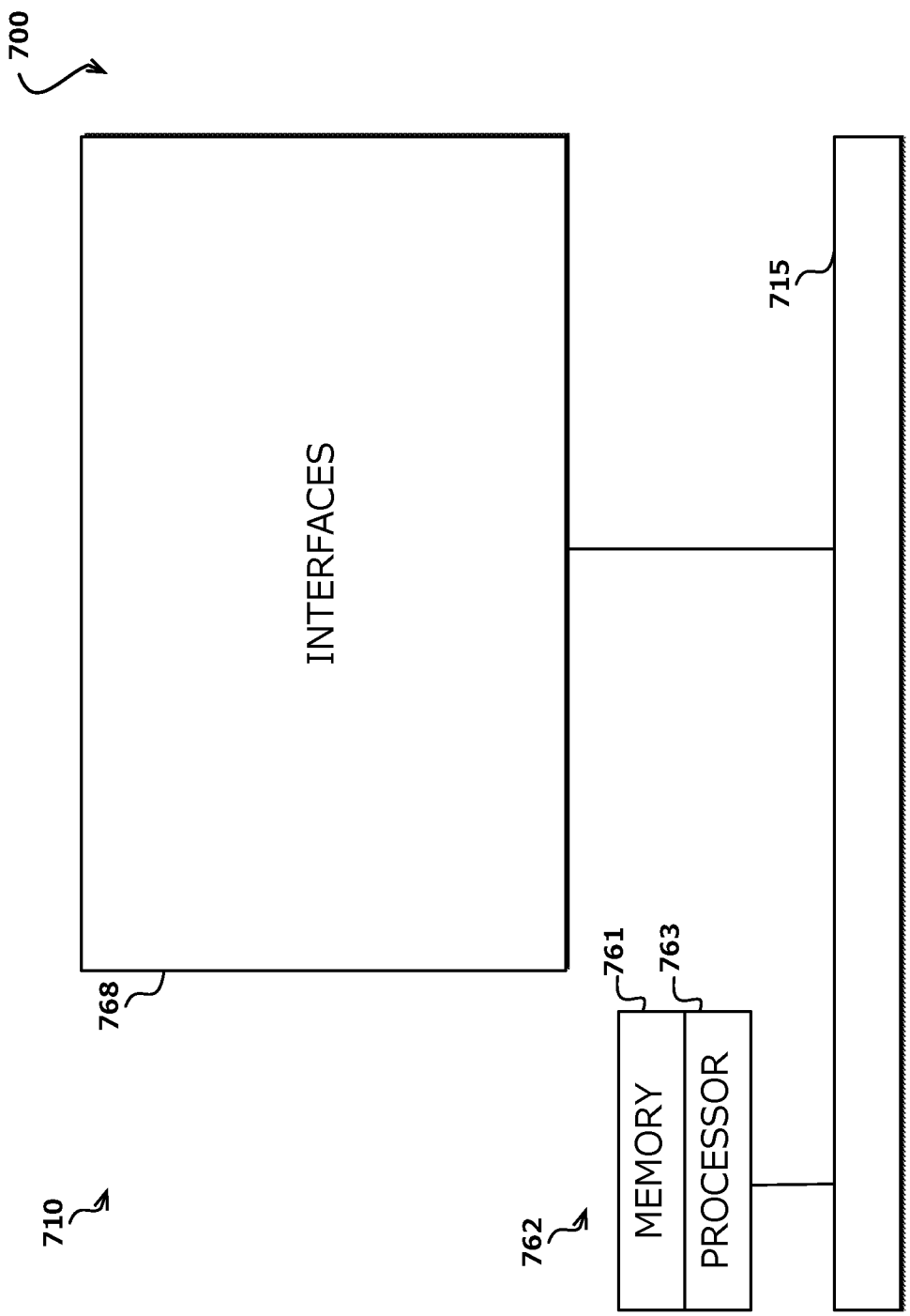
FIG. 7 illustrates an exemplary access device, such as a cable modem, that can be utilized in accordance with various embodiments.

FIG. 7 illustrates example 700 of an exemplary network device 710, such as a cable modem, that can be utilized in accordance with various embodiments. Network device 710 includes a master central processing unit (CPU) 762, interfaces 768, and a bus 715 (e.g., a PCI bus). When acting under the control of appropriate software or firmware, the CPU 762 is responsible numerous tasks, at least some of which relate to network management. It preferably accomplishes all these functions under the control of software including an operating system and any appropriate applications software. CPU 762 may include one or more processors 763. In an alternative embodiment, processor 763 is specially designed hardware for controlling the operations of network device 710. In a specific embodiment, a memory 761 (such as non-volatile RAM and/or ROM) also forms part of CPU 762. However, there are many different ways in which memory could be coupled to the system.

The interfaces 768 are typically provided as interface cards (sometimes referred to as "line cards"). Generally, they control the sending and receiving of data packets over the network and sometimes support other peripherals used with the router 710. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 762 to efficiently perform routing computations, network diagnostics, security functions, etc.

Although the system shown in FIG. 7 is one specific network device of the present invention, it is by no means the only network device architecture on which the present invention can be implemented. For example, an architecture having a single processor that handles communications as well as routing computations, etc. is often used. Further, other types of interfaces and media could also be used with the router.

Figure 8:
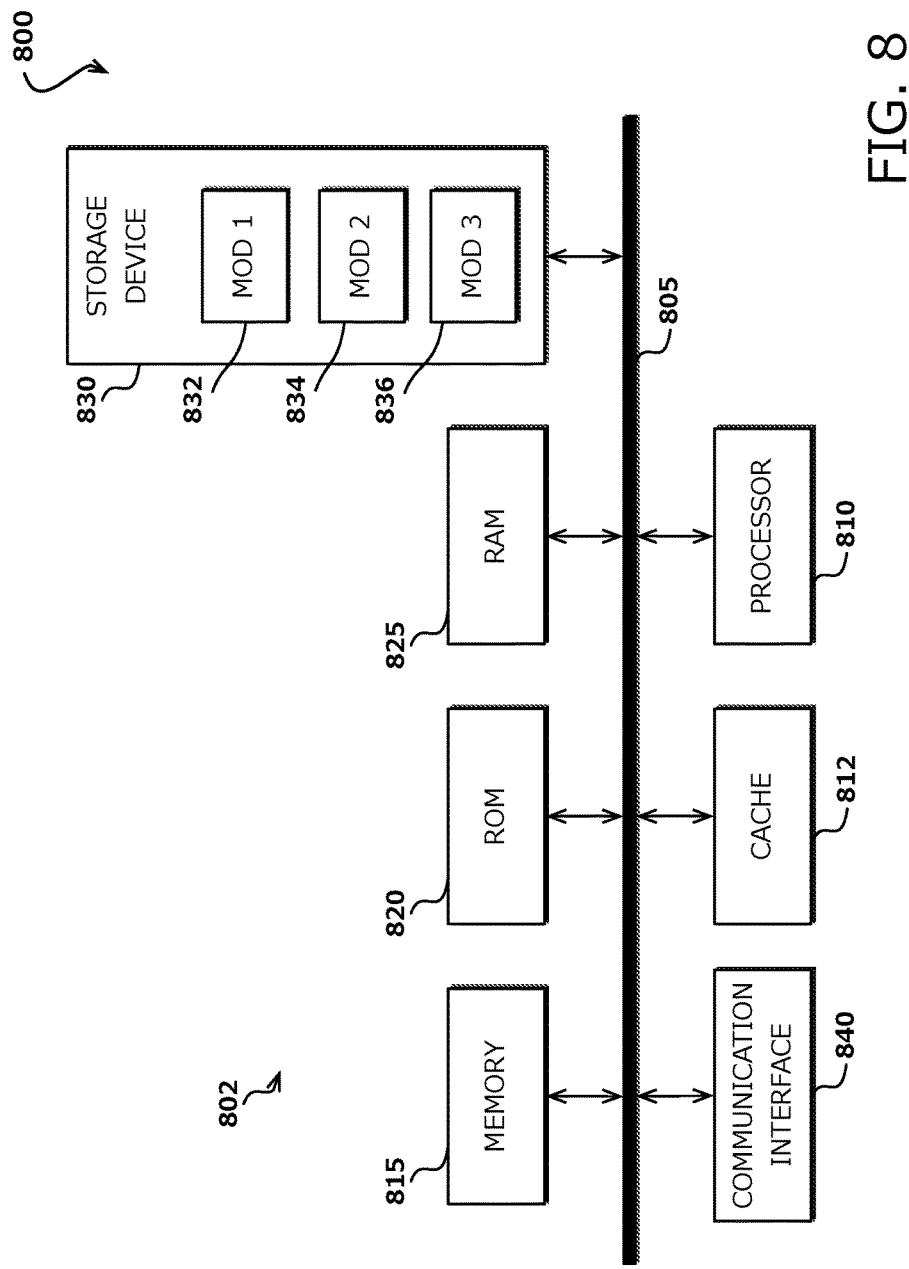
FIG. 8 illustrates example components of an access device, such as the access device illustrated in FIG. 7.

Regardless of the network device's configuration, it may employ one or more memories or memory modules (including memory 761) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc. FIG. 8 illustrates example components of an access device, such as the access device illustrated in FIG. 7.

FIG. 8 illustrates example components of an access device, such as the access device illustrated in FIG. 7. The more appropriate embodiment will be apparent to those of ordinary skill in the art when practicing the present technology. Persons of ordinary skill in the art will also readily appreciate that other system embodiments are possible. FIG. 8 illustrates a conventional system bus computing system architecture 802 wherein the components of the system are in electrical communication with each other using a bus 805.

Exemplary system 800 includes a processing unit (CPU or processor) 810 and a system bus 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware module or software module, such as module 1 832, module 2 834, and module 3 836 stored in storage device 830, configured to control the processor 810 as well as a special-purpose processor where software instructions are incorporated into the actual processor design. The processor 810 may essentially be a completely self-contained computing system, containing multiple cores or processors, a bus, memory controller, cache, etc. A multi-core processor may be symmetric or asymmetric. The processor can be implemented with one or more virtual processors, as well as any combination of CPUs and virtual processors.

The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, any other memory chip or cartridge, or any other medium from which a computer can read. Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 805 for transmitting a computer data signal.

The storage device 830 can include software modules 832, 834, 836 for controlling the processor 810. Other hardware or software modules are contemplated. The storage device 830 can be connected to the system bus 805. In one aspect, a hardware module that performs a particular function can include the software component stored in a computer-readable medium in connection with the necessary hardware components, such as the processor 810, bus 805, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general-purpose computer, special purpose computer, or special purpose processing device to perform a certain function or group of functions. In some examples, hard-wired circuitry may be used in place of or in combination with software instructions for implementation. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to determine and/or monitor spectral information of a communications signal using novel integrated circuits in a communications network.

Most embodiments utilize at least one communications network that would be familiar to those skilled in the art for supporting communications using any of a variety of commercially available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random-access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used, and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computing system, comprising:
a set of analog-to-digital converters (ADCs) configured to receive a time-domain representation of a signal and generate an output signal;
a segment controller configured to:
segment the output signal into a plurality of segments,
determine a center frequency for a segment of the plurality of segments,
determine a segment bandwidth for the segment based at least in part on a sampling frequency associated with the set of analog-to-digital converters, a number of segments included in the plurality of segments, and a resolution mode, and
apply the center frequency of the segment to a digital mixer;
the digital mixer configured to translate a frequency associated with the segment to a baseline frequency to generate a translated signal segment based at least in part on the center frequency;
a decimation filter configured to adjust a rate of the translated signal segment based at least in part on a determined resolution mode to generate an adjusted translated signal segment;
a spectral analysis component configured to generate a frequency-domain representation of the adjusted translated signal segment; and
a power component configured to generate power spectral information for the frequency-domain representation of the adjusted translated signal segment, wherein the power spectral information for a plurality of frequency-domain representations of the plurality of segments is stored.

2. The computing system of claim 1, wherein the spectral analysis component when configured to generate the frequency-domain representation of the adjusted translated signal segment is further configured to:
use a fast Fourier transform technique on the adjusted translated signal segment to generate the frequency-domain representation of the adjusted translated signal segment.

3. The computing system of claim 1, wherein the segment controller is further configured to:
determine a start frequency for individual segments of the plurality of segments based at least in part on a number of segments of the plurality of segments and the segment bandwidth.

4. The computing system of claim 3, wherein the segment controller is further configured to:
determine the center frequency for the segment based at least in part on the start frequency, the segment bandwidth, and a segment position of the segment.

5. The computing system of claim 1, further comprising:
a filter component configured to filter the translated signal segment, wherein the filter component includes at least the decimation filter.

6. The computing system of claim 5, wherein the filter component is programmable, and wherein a decimation rate of the filter component is programmed based at least in part on a resolution mode.

7. The computing system of claim 1, further comprising:
a buffer component configured to buffer a plurality of translated signal segments obtained from a filter component, wherein individual buffered translated signal segments are processed by the spectral analysis component.

8. The computing system of claim 1, further comprising:
an averaging component configured to average the power spectral information for the plurality of segments.

9. The computing system of claim 1, wherein the computing system is implemented on a chip.

10. An apparatus, comprising:
a set of analog-to-digital converters (ADCs);
at least one computing device processor; and
a memory device including instructions that, when executed by the at least one computing device processor, enables the at least one computing device processor to:
process a time-domain representation of a communications signal to generate a digital representation of the communications signal,
segment the digital representation of the communications signal into a plurality of segments,
determine a center frequency for a segment of the plurality of segments,
determine a segment bandwidth for the segment based at least in part on a sampling frequency associated with the set ADCs, a number of segments included in the plurality of segments, and a resolution mode,
translate a frequency associated with the segment to a baseline frequency to generate a translated signal segment based at least in part on the center frequency,
use a spectral analysis technique on the translated signal segment to generate a frequency-domain representation of the translated signal segment
determine a power spectral information for the frequency-domain representation of the segment, and
store the power spectral information for a plurality of frequency-domain representations of the plurality of segments.

11. The apparatus of claim 10, wherein the instructions when executed by the at least one computing device processor further enable the at least one computing device processor to:
use a fast Fourier transform technique on the translated signal segment to generate the frequency-domain representation of the translated signal segment.

12. The apparatus of claim 10, wherein the instructions when executed by the at least one computing device processor further enable the at least one computing device processor to:
determine a start frequency for individual segments of the plurality of segments based at least in part on a number of segments of the plurality of segments and the segment bandwidth.

13. The apparatus of claim 12, wherein the instructions when executed by the at least one computing device processor further enable the at least one computing device processor to:
  determine the center frequency for the segment based at least in part on the start frequency, the segment bandwidth, and a segment position of the segment.

14. The apparatus of claim 10, wherein the instructions when executed by the at least one computing device processor further enable the at least one computing device processor to:
  program a filter component based at least in part on a resolution mode; and
  filter the translated signal segment.

15. The apparatus of claim 10, wherein the instructions when executed by the at least one computing device processor further enable the at least one computing device processor to:
  buffer a plurality of translated signal segments obtained from a filter component; and
  process individual buffered translated signal segments by a spectral analysis component.

16. A method, comprising:
  processing a time-domain representation of a communications signal to generate a digital representation of the communications signal;
  segmenting the digital representation of the communications signal into a plurality of segments;
  determining a center frequency for a segment of the plurality of segments,
  determining a segment bandwidth for the segment based at least in part on a sampling frequency associated with a set of analog-to-digital converters, a number of segments included in the plurality of segments, and a resolution mode,
  translating a frequency associated with the segment to a baseline frequency to generate a translated signal segment based at least in part on the center frequency;
  using a spectral analysis technique on the translated signal segment to generate a frequency-domain representation of the translated signal segment;
  determining a power spectral information for the frequency-domain representation of the segment; and
  storing the power spectral information for a plurality of frequency-domain representations of the plurality of segments.

17. The method of claim 16, further comprising:
  obtaining information for a resolution mode; and
  programming a decimation filter with a decimation rate based at least in part on the resolution mode.

18. The method of claim 16, further comprising:
  filtering the translated signal segment;
  buffering the translated signal segment;
  using a fast Fourier transform technique on the translated signal segment to generate the frequency-domain representation of the translated signal segment; and
  averaging the power spectral information for the frequency-domain representation of the translated signal segment.

* * * * *